United States Patent
Yamada

(10) Patent No.: US 7,082,066 B2
(45) Date of Patent: Jul. 25, 2006

(54) FLASH MEMORY HAVING SPARE SECTOR WITH SHORTENED ACCESS TIME

(75) Inventor: Shigekazu Yamada, Suginami (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/170,183

(22) Filed: Jun. 30, 2005

(65) Prior Publication Data

US 2005/0254322 A1 Nov. 17, 2005

Related U.S. Application Data

(63) Continuation of application No. PCT/JP03/05503, filed on Apr. 30, 2003.

(51) Int. Cl.
*G11C 7/00* (2006.01)

(52) U.S. Cl. .................. 365/200; 365/189.05

(58) Field of Classification Search ............... 365/200, 365/189.05, 201, 230.03
See application file for complete search history.

(56) References Cited

U.S. PATENT DOCUMENTS

| | | | | |
|---|---|---|---|---|
| 4,346,459 A | * | 8/1982 | Sud et al. | 365/200 |
| 5,477,492 A | * | 12/1995 | Ohsaki et al. | 365/200 |
| 5,930,183 A | * | 7/1999 | Kojima et al. | 365/200 |
| 6,084,806 A | | 7/2000 | Sugibayashi | |
| 6,219,285 B1 | | 4/2001 | Murakuki et al. | |
| 6,269,034 B1 | | 7/2001 | Shibuya | |
| 6,310,803 B1 | | 10/2001 | Hidaka | |
| 6,865,133 B1 | * | 3/2005 | Tsukidate et al. | 365/230.01 |

FOREIGN PATENT DOCUMENTS

| | | |
|---|---|---|
| JP | 58-164096 A | 9/1983 |
| JP | 11-242896 A | 9/1999 |
| JP | 2000-149587 A | 5/2000 |
| JP | 2000-187995 A | 7/2000 |
| JP | 2000-357395 A | 12/2000 |

* cited by examiner

*Primary Examiner*—Anh Phung
(74) *Attorney, Agent, or Firm*—Arent Fox PLLC

(57) ABSTRACT

A semiconductor memory has regular sectors, a spare sector replaced from the regular sectors, and regular sector selection signal generating circuit and a spare sector selection signal generating circuit, which in response to an address change signal generate a regular sector selection signal and a spare sector selection signal. It also has a redundancy memory that stores replacement information read out in response to the address change signal, and a reference redundancy memory read out in response to the address change signal and generating an output signal that changes when this memory information readout is completed. Then, in response to the change in output signal of the reference redundancy memory, either the regular sector selection signal or the spare sector selection signal is set to the deselected state, based on the replacement information.

7 Claims, 9 Drawing Sheets

FLASH MEMORY HAVING SPARE SECTOR WITH SHORTENED ACCESS TIME

CROSS-REFERENCE TO RELATED APPLICATION

This non provisional application is a Continuation Application of and claims the benefit of International Application Number PCT/JP03/05503, filed Apr. 30, 2003. The disclosure of the prior application is hereby incorporated herein in its entirety by reference.

BACKGROUND OF THE INVENTION

1. Field of the Invention

The present invention relates to a flash memory having a spare sector, and more particularly to a flash memory that prevents access time delays owing to determination of whether or not there has been replacement to the spare sector.

2. Description of the Related Art

Flash memory is widely used as a type of non-volatile semiconductor memory. Flash memory is a semiconductor memory comprising a cell transistor having a floating gate or trap gate, and the memory core generally comprises a plurality of sectors. Within each sector a plurality of word lines, a plurality of bit lines, and a plurality of cell transistors are provided, making up the erase units. Consequently, a sector is a kind of memory block, each one having at least a word decoder. In addition to a row address that selects the word line and a column address that selects the bit line, an externally supplied address includes a sector address that selects the sector.

For reasons related to the manufacturing process, it is not easy to eradicate defective bits from semiconductor memory completely. In order to improve the yield rate, therefore, spare memory is installed in advance and if any defective bits are detected during the performance test that is carried out during the last stage of the manufacturing process, then the domain containing the defective bits is replaced by the spare memory. The fact that these bad bits have been replaced by spare memory is recorded in a memory called a redundant memory. Arrangements of this kind using redundant memory have been widely employed in DRAM memory for some time, and have recently come to be employed in flash memory too as the capacity of these devices has increased.

The redundancy structure as employed in DRAM has a spare memory cell array provided in a vertical column direction as well as a regular memory cell array. When a word line is selected in accordance with the row address and driven, a word line common to the regular memory cell array and the spare memory cell array is booted. Parallel with this, a check is carried out to detect whether the external column address corresponds to bad bits that have been replaced, and based on the results of this either the regular memory cell array or the spare memory cell array is selected. An example of a DRAM redundancy structure of this type is described in Japanese Patent Application Laid-open No. 2000-149587.

According to the invention described in Japanese Patent Application Laid-open No. 2000-149587, a column redundancy detection circuit is provided that determines whether the column address supplied matches a bad column and in response to the result of this deactivates the regular column decoder and activates the redundancy column decoder. As a consequence of this the timing set by the regular column selection and the timing set by the redundancy column selection become out of step with one another; one issue arising from this is that it becomes necessary to provide sufficient time between the end of the data line pre-charge and the start of amplification. According to Japanese Patent Application Laid-open No. 2000-149587, a dummy redundancy detection circuit is provided in order to resolve this problem, which detects the unequal redundancy result timing and activates the column decoder on the regular memory cell side and the redundancy column decoder on the spare memory cell side at the same time according to this timing. In this way, it is possible to bring the timing of the column selection on the regular memory cell side and the spare memory cell side into accordance with one another, thus shortening the time mentioned above between the end of the data line pre-charge and the start of amplification.

The flash memory according to the present invention, on the other hand, has a sector structure, with a word decoder provided in each sector. In addition to the regular sectors, a spare sector is provided for rescuing any bad sector. The basic structure of the present invention is thus fundamentally different from that of Japanese Patent Application Laid-open No. 2000-149587. In a flash memory of the sector structure type, then, with the object of shortening access time, both the regular sector and the spare sector are activated in response to an ATD (address transition detection) signal generated when a change in address is detected during access; in parallel with this a check is carried out to detect any spare sector replacement. When the presence or absence of any replacement has been detected, either the regular sector or the spare sector is deactivated. Consequently, there is no discrepancy between the activation timing of the regular sector and the spare sector, and the issues arising differ from those faced when using Japanese Patent Application Laid-open No. 2000-149587.

One issue with a flash memory of the sector-type structure, however, is that the timing of the readout completion of the redundancy memory that stores the replacement information regarding replacement to the spare memory can sometimes fluctuate owing to the circuit design or uneven manufacture. As a consequence of this fluctuation in the timing of the redundancy memory readout completion, a sufficient margin needs to be allowed for when setting the redundancy detection timing.

FIG. 1 shows the operation procedure of conventional redundancy detection. A regular sector selection signal generating circuit 16 and a spare sector selection signal generating circuit 18 are provided in relation to a regular sector SEC and a spare sector SSEC, and a regular sector selection signal RSEC and a spare sector selection signal SSEC are generated. In response to the rising edge of the ATD signal, the selection signal generating circuits 16, 18 set the selection signals RSEC, SSEC to the activated state (H-level) at the same time. In response to this, the row decoders within the regular sector SEC and the redundancy sector SSEC are activated, and begin their decoding operations. Also, in response to the ATD signal, the redundancy memory 10 is activated and starts its readout operation. The redundancy memory 10 comprises a contents addressable memory (CAM) for example; it stores whether the supplied sector address is a replaced sector or not, and outputs this replacement information COUT (CAM output signal). According to the structure of the redundancy memory 10, if replacement with the spare memory is necessary then this replacement information changes from its initial L-level state to H-level, but maintains its L-level if no replacement is necessary. This means that there is no way to determine the timing of the completion of the readout operation from its output COUT.

For this reason, a timing circuit 12 is provided, which generates a ready signal READY having a pulse width of a determined time dt having a sufficient operation margin from the rising edge of the ATD signal; in response to the timing of the rising edge of the ready signal READY, the redundancy memory output circuit 14 supplies the replacement signals COUT-R, COUT-S to the selection signal generating circuits 16, 18. As shown in the timing chart in FIG. 1, if the memory data of the redundancy memory is at RM=1, then it shows that no replacement is necessary; the output COUT=L, the regular sector selection signal RSEC is maintained at H-level, and the spare sector selection signal SSEC is set to L-level. If the memory data of the redundancy memory is at RM=0, on the other hand, it shows that replacement to the spare memory is necessary, and the output COUT=H; the regular sector selection signal RSEC is set to L-level, and the spare sector selection signal SSEC is maintained at H-level.

However, as shown when the memory data of the redundancy memory was at RM=0, even if the readout operation of the redundancy memory 10 is completed faster than the timing of the ready signal READY, the timing of the determination is controlled by the timing of the ready signal; one issue arising from this is that it is not possible to speed up the de-selection of the selection signal generating circuits 16, 18. This in turn leads to the problem of longer access times within the flash memory.

It is an object of the present invention, therefore, to provide a flash memory having a spare sector with a shortened access time.

A further object of the present invention is to provide a flash memory capable of higher-speed redundancy detection.

SUMMARY OF THE INVENTION

A first aspect of the present invention is a semiconductor memory having a plurality of regular sectors and a spare sector that can be replaced from the regular sectors, having a regular sector selection signal generating circuit and a spare sector selection signal generating circuit, which in response to an address change signal generate a regular sector selection signal that selects the regular sector and a spare sector selection signal that selects the spare sector respectively. It also has a redundancy memory that stores replacement information on whether where a regular sector has been replaced with the spare sector, read out in response to the address change signal, and a reference redundancy memory that has the same memory elements as the redundancy memory; these memory elements are read out in response to the address change signal, and an output signal is generated that changes when this memory information readout is completed. Then, in response to the change in output signal of the reference redundancy memory, either the regular sector selection signal or the spare sector selection signal is set to the deselected state, based on the replacement information read out from the redundancy memory.

By means of the first aspect of the present invention, the regular sector and the spare sector are selected at the same time accompanying the address change, and access operations begin. Then either the regular sector or the spare sector is set to the deselected state based on the replacement information read out from the redundancy memory. This makes it possible to start the sector operations sooner, thus shortening the access time. Furthermore, according to this first aspect the reference redundancy memory detects the readout timing of the redundancy memory and changes its output signal, making it possible to determine the replacement information of the redundancy memory at the same time, thus making it possible to fix either the regular sector or the spare sector in the selected state sooner.

Within a preferred embodiment of the first aspect of the present invention described above, the reference redundancy memory has a first and a second reference redundancy memory that store a first and a second information respectively that can be stored by the redundancy memory, and that change their output during readout; when both of the outputs of the first and the second reference redundancy memory change, the output signal of the reference redundancy memory is generated. Consequently, since the output signal of the reference redundancy memory is generated according to a timing corresponding to the longest time required for the redundancy memory readout, it is possible to determine the replacement information of the redundancy memory by the shortest possible timing.

DESCRIPTION OF THE PREFERRED EMBODIMENTS

A description follows of possible embodiments of the present inventions, with reference to the figures attached. However, it should be noted that the technical scope of the present invention is not limited to the embodiments described below, but extends to cover any and all applications equivalent to the invention as recited in the Claims below.

Figure 1:
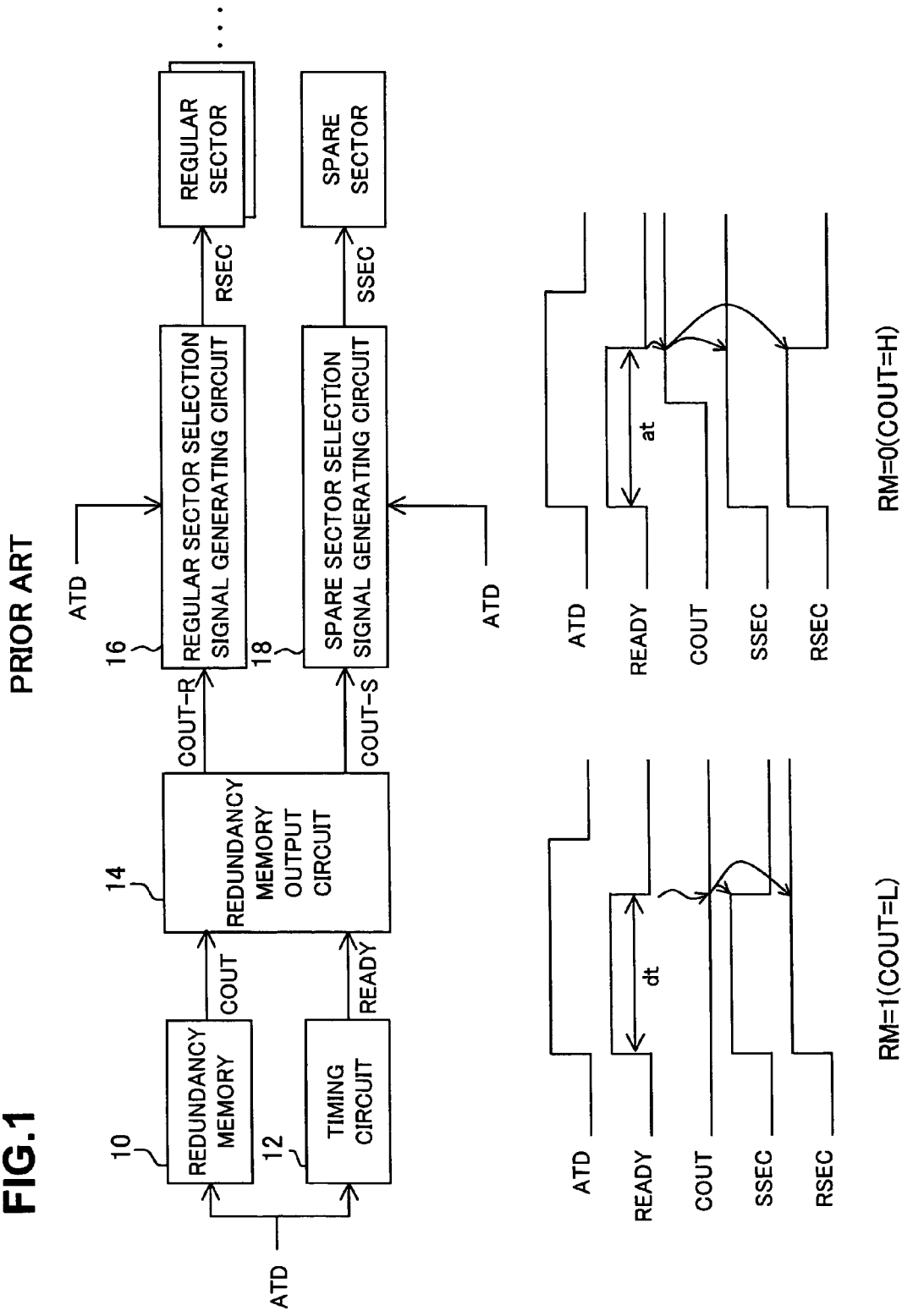
FIG. 1 shows a conventional redundancy detection operation.
Figure 2:
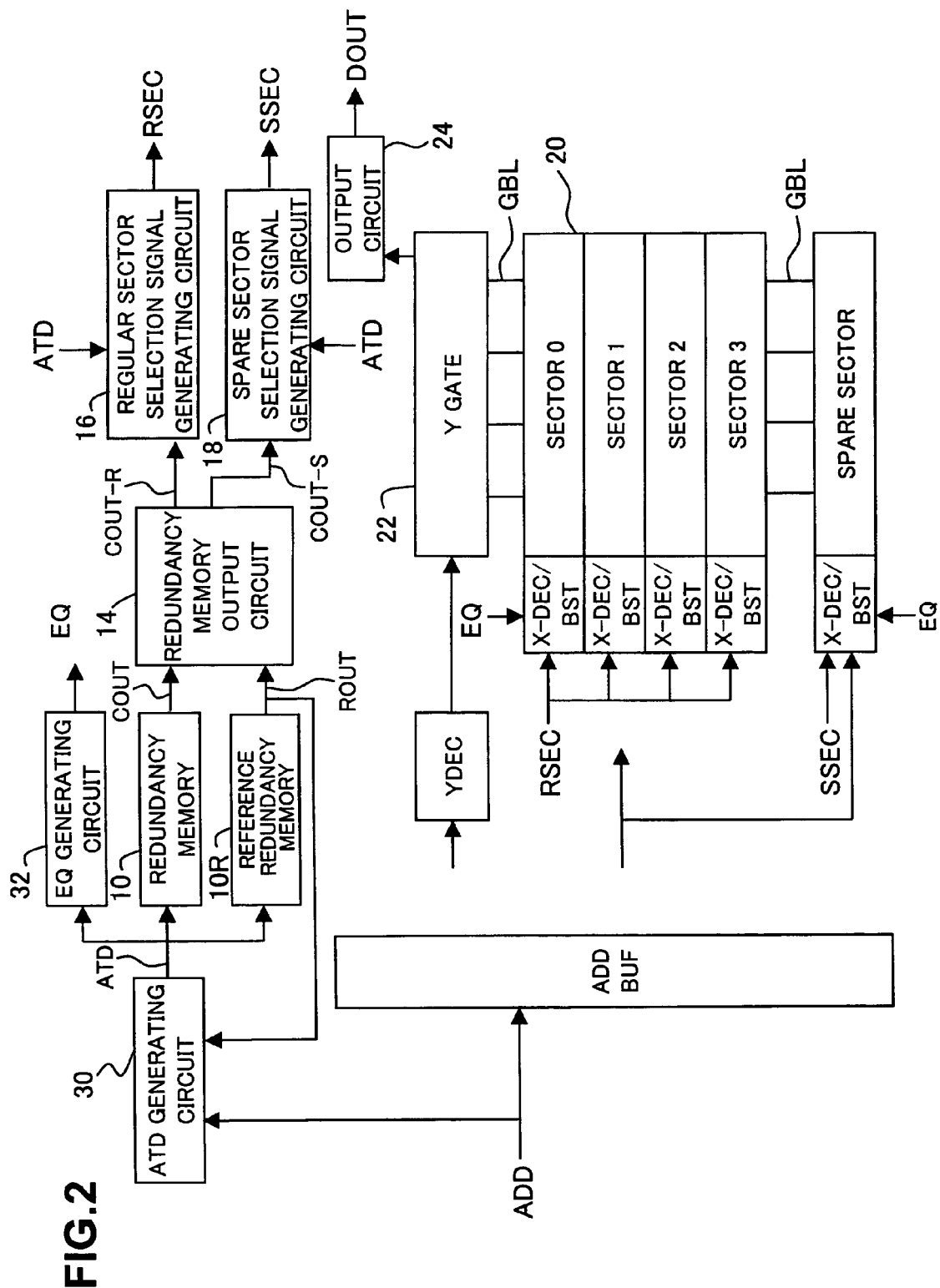
FIG. 2 shows the overall structure of a flash memory according to this embodiment.

FIG. 2 shows the overall structure of the flash memory according to the present embodiment. In the flash memory shown in FIG. 2, the regular sector 20 comprises four regular sectors SEC0-SEC3 and a spare sector SSEC for rescuing a regular sector having defects. Within each sector, a row detector X-DEC and a booster circuit BST that boosts the voltage of a word line selected by the row detector is provided. The regular sectors SEC0-3 and the spare sector SSEC share a global bit line GBL, and the local bit line within each sector is connected to this global bit line GBL by the sector selection signal. The global bit line GBL is connected to the output circuit 24 via the Y gate 22, and the data output Dout is outputted from the output circuit 22. Within each sector, a cell transistor having a floating gate is provided at each point of intersections between the word line and the local bit line. This cell transistor is a non-volatile memory that preserves memory data even when the power source is turned off.

Further, the flash memory shown in FIG. 2 has an address buffer ADDBUFF that inputs a supplied address ADD; the inputted row address is then supplied to a row detector X-DEC within each sector, while the column address is supplied to a column decoder Y-DEC. An ATD generating circuit 30 is also provided that generates a one-shot pulse address change signal ATD in response to a change in the address ADD; the redundancy memory 10 and the reference redundancy memory 10R start their memory information readout operations in response to this address change signal ATD. The redundancy memory 10 and the reference redundancy memory 10R together have a cell transistor the same as the cell transistor within the sectors; the redundancy memory 10 stores the replacement information that replaces a regular sector with the spare sector, and reads out this replacement information in response to the address change signal ATD. The reference redundancy memory 10R, meanwhile, has the same cell transistor as the redundancy memory 10; it stores the specified information, and reads out this memory information in response to the address change signal ATD, generating an output signal that changes when the readout is completed. This specified information is that for which the readout time within the redundancy memory 10 is the last to be completed, so that the timing at which the output ROUT of the reference redundancy memory 10R changes coincides with the shortest total readout time required by the redundancy memory 10. Consequently, the redundancy memory output circuit 14 determines the output COUT of the redundancy memory 10 according to the timing of this output ROUT, switching either the redundancy memory output COUT-R or COUT-S to the selected state based on this output COUT, and the other to the deselected state.

The address change signal ATD is also supplied to the EQ generating circuit 32, and generates a sector activation signal EQ when the one-shot pulse of the address change signal ATD dies out. This sector activation signal EQ acts as a trigger signal that drives the word lines within the sector to the selected level.

Figure 3:
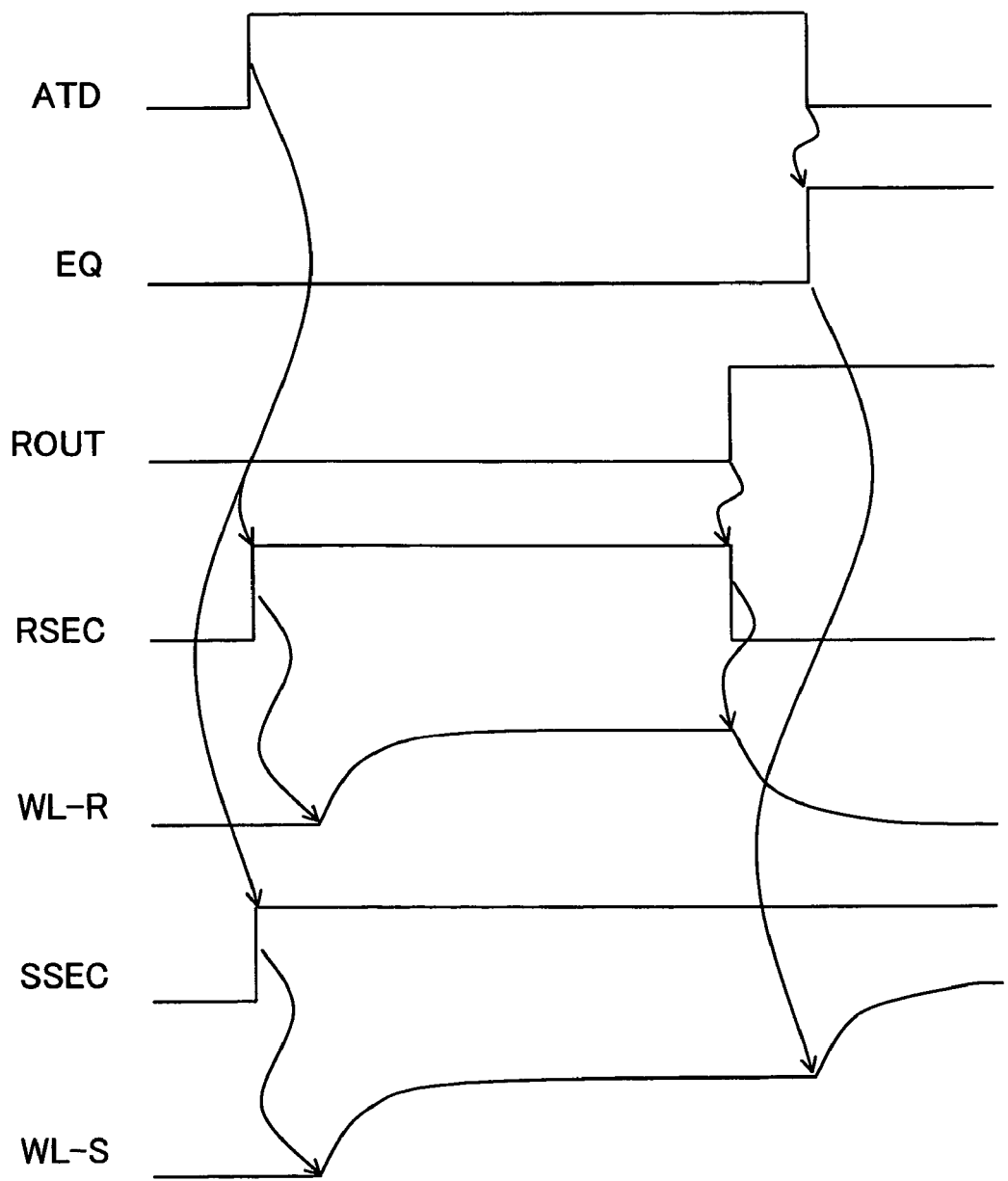
FIG. 3 is a timing chart illustrating the operations of the flash memory.

FIG. 3 is a timing chart for the operations of the flash memory. In response to a change in address ADD, a one-shot pulse address change signal ATD is generated. In response to the rising edge of the address change signal ATD, the regular sector selection signal RSEC and the spare sector selection signal SSEC switch to the selected state, and the row decoders X-DEC within the regular sectors SEC0-3 and the spare sector SSEC start their decoding operations. At this time a regular sector selection signal RSEC is given only to regular sectors within the four regular sectors that selected by means of a sector address not shown in the figure. This simultaneous selected state in both sectors causes the word line WL-R within the regular sector and the word line WL-S within the spare sector to be driven together to the power source voltage. In parallel with this simultaneous selected state in both sectors, the redundancy memory 10 and the redundancy memory 10R both start their readout operations in response to the address change signal ATD. When the reference redundancy memory 10R completes its readout, its output ROUT changes from L-level to H-level, whereupon the redundancy memory output circuit 14 sets either the redundancy memory output COUT-R or COUT-S to the selected state and the other to the deselected state in response to the output COUT of the redundancy memory 10. In the example shown in FIG. 3, the output COUT of the redundancy memory 10 corresponds to replacement information replaced to the spare sector, so that the output COUT-R goes to L-level (deselected state) and the output COUT-S goes to H-level (selected state). As a result, the regular sector selection signal RSEC changes to the L-level (deselected state); the regular sector row decoder X-DEC stops its decoding operation in response, and the voltage of the word lines WL-R falls from power source voltage to ground level. The spare sector selection signal SSEC, on the other hand, maintains H-level (selected state). After this, in response to the rising edge of the sector activation signal EQ generated in response to the rising edge of the address change signal ATD, the word lines WL-S within the spare sector are driven by the booster circuit BST to a boost voltage level (selected level) higher than the voltage of the power source.

In this way, the flash memory according to the present embodiment sets a selected regular sector and the spare sector to the selected state at the same time in response to a change in address, and causes the row decoders housed within each sector to begin decoding at the same time. Parallel with this decoding operation, the replacement information of the redundancy memory 10 is read out; when this readout is completed, the selected state of either the regular sector or the spare sector is stopped, and the sector selected by the replacement information of the redundancy memory 10 maintains its selected state. The readout of that sector then continues in response to the next sector activation signal EQ. In this way, the sector-structure flash memory makes it possible to avoid any slowing down of access due to the readout decision of the redundancy memory.

Figure 4:
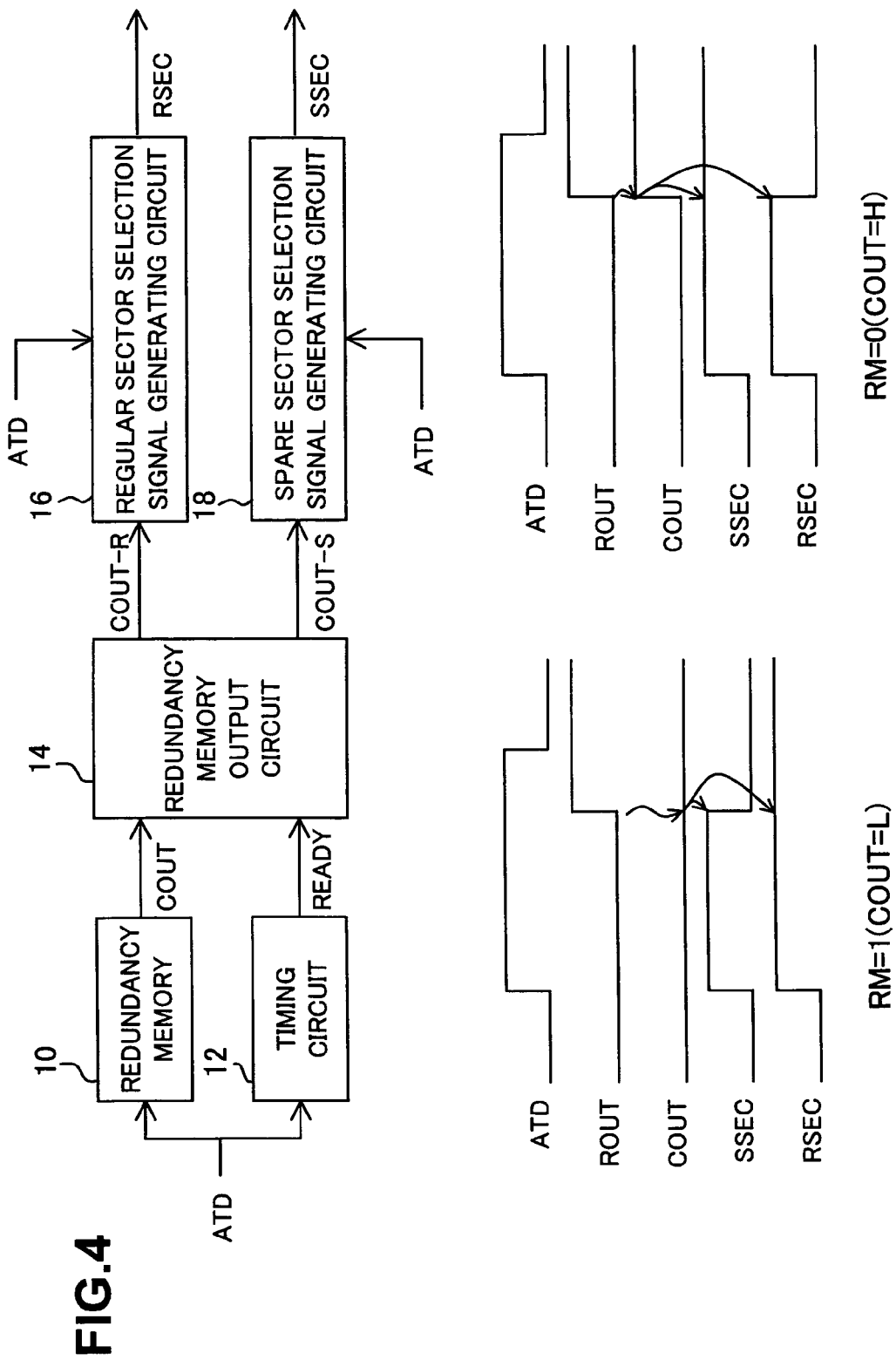
FIG. 4 shows a first embodiment of the present invention.

FIG. 4 shows a first embodiment of the present invention. In this embodiment, the data with the longest readout time within the redundancy memory 10 is written to the reference redundancy memory 10R. Then when the readout of this written data is completed, the output ROUT of the reference redundancy memory 10R changes from L-level to H-level. Then the redundancy memory output circuit 14 determines the output COUT of the redundancy memory 10 in response to the change of the output ROUT, and based on this output COUT, turns either the output COUT-R or COUT-S to H-level, and the other to L-level. In response to this, the sector selection signal generating circuits 16, 18 that have been supplied with the L-level output COUT-R, COUT-S, switch the selection signals RSEC, SSEC to L-level (deselected state).

The timing chart shown in FIG. 4 shows an example in which the data in the redundancy memory 10 is at RM=1 (there is no replacement to the spare memory) and an example in which it is at RM=0 (there is replacement to the spare memory). As mentioned above, the redundancy memory 10 is a contents addressable memory that stores whether spare sector replacement is carried out or not for each sector address. According to an alternative structure, it is also possible that the sector address of any regular sector that was replaced to the spare memory is stored inside the redundancy memory 10. In this case, the stored sector address of the regular sector replaced by the spare memory is read out and compared to the sector address supplied; the result of this comparison is then outputted as the output COUT of the redundancy memory.

When the readout of the redundancy memory 10 is completed following the rising edge of the address change signal ATD, the output ROUT of the reference redundancy memory 10R changes from L-level to H-level. In response to this change in the output ROUT, the redundancy memory output circuit 14 refers to the output COUT of the redundancy memory 10, and based on this outputs the outputs COUT-R, COUT-S. If the data of the redundancy memory 10 is RM=1 (no replacement to the spare sector), then the output COUT-R is put to H-level and the output COUT-S is put to L-level. As a consequence, the spare sector selection signal SSEC is put to L-level (deselected) and the regular sector selection signal RSEC maintains H-level (selected state). At this, the row decoders on the spare sector side stop decoding. On the other hand, if the data of the redundancy memory 10 is at RM=0 (there is transfer to the spare sector), then the opposite takes place. In this case, the output COUT of the redundancy memory 10 switches from L-level to H-level at the completion of the readout, but the output RCOUT of the reference redundancy memory 10R changes at the same time. The redundancy memory output circuit 14 puts the output COUT-R to L-level at the same time, and as a consequence the regular sector selection signal RSEC is switched to L-level (deselected state).

The timing of the change of the output RCOUT of the reference redundancy memory 10R depends on the timing of the readout completion of memory to which slow readout data was recorded, rather than on the slower timing according to the conventional art described above that allowed an operating margin such as the ready signal READY that was generated a predetermined time after the rising edge of the address change signal ATD. Consequently, the determination time required to select the regular sector or the spare sector is speeded up, so that it is possible to start the voltage boosting of the word lines by the sector activation signal EQ sooner, thereby reducing the access time as a whole.

Figure 5:
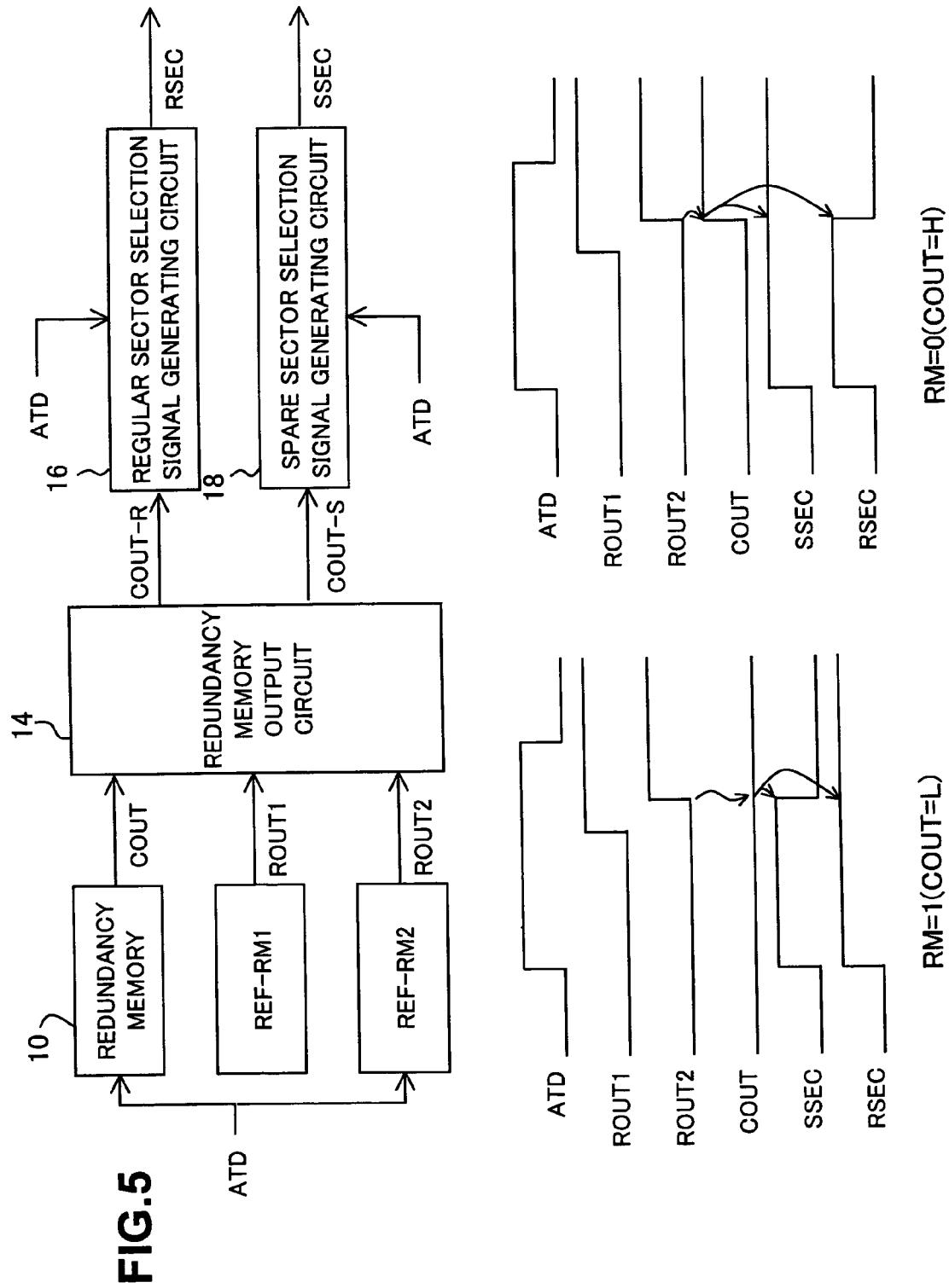
FIG. 5 shows a second embodiment of the present invention.

FIG. 5 shows a second embodiment. In this second embodiment the reference redundancy memory comprises a first reference redundancy memory Ref-RM1 and a second reference redundancy memory Ref-RM2, which store [1] and [0]-type data stored in the redundancy memory 10 respectively. The outputs ROUT1, ROUT2 of the first and the second reference redundancy memories change from L-level to H-level when the readout operation is completed, so that the readout operation of the redundancy memory 10 is sure to be completed by the time when these two outputs ROUT1, ROUT2 have switched to H-level together. The redundancy memory output circuit 14 puts one of the outputs COUT-R, COUT-S to H-level and the other to L-level based on the output COUT of the redundancy memory 10. Consequently, either the regular sector section signal RSEC or the spare sector selection signal SSEC is set to the deselected state (L-level) while the other maintains the selected state (H-level).

In the timing chart shown in FIG. 5, the output ROUT2 of the second reference redundancy memory Ref-RM2 changes to H-level later. Consequently, the redundancy memory output circuit 14 outputs the outputs COUT-R, COUT-S based on the output COUT of the redundancy memory 10 at the time at which this change in the output ROUT2 takes place.

In the second embodiment, by providing two reference redundancy memories, and having each of them store one of the two kinds of data [1] and [0] that the redundancy memory 10 stores, it is possible to construct a reference redundancy memory without worrying about either data readout being slower than the other. If the redundancy memory 10 stores four separate kinds of data (2 bits, 4 values), it is also possible to provide four reference memories and have them store one each. Then, by determining the output of the redundancy memory 10 when the output of every one of the reference redundancy memories has changed, it is possible accurately to fix the output of the redundancy memory 10 in the shortest possible time.

Figure 6A:
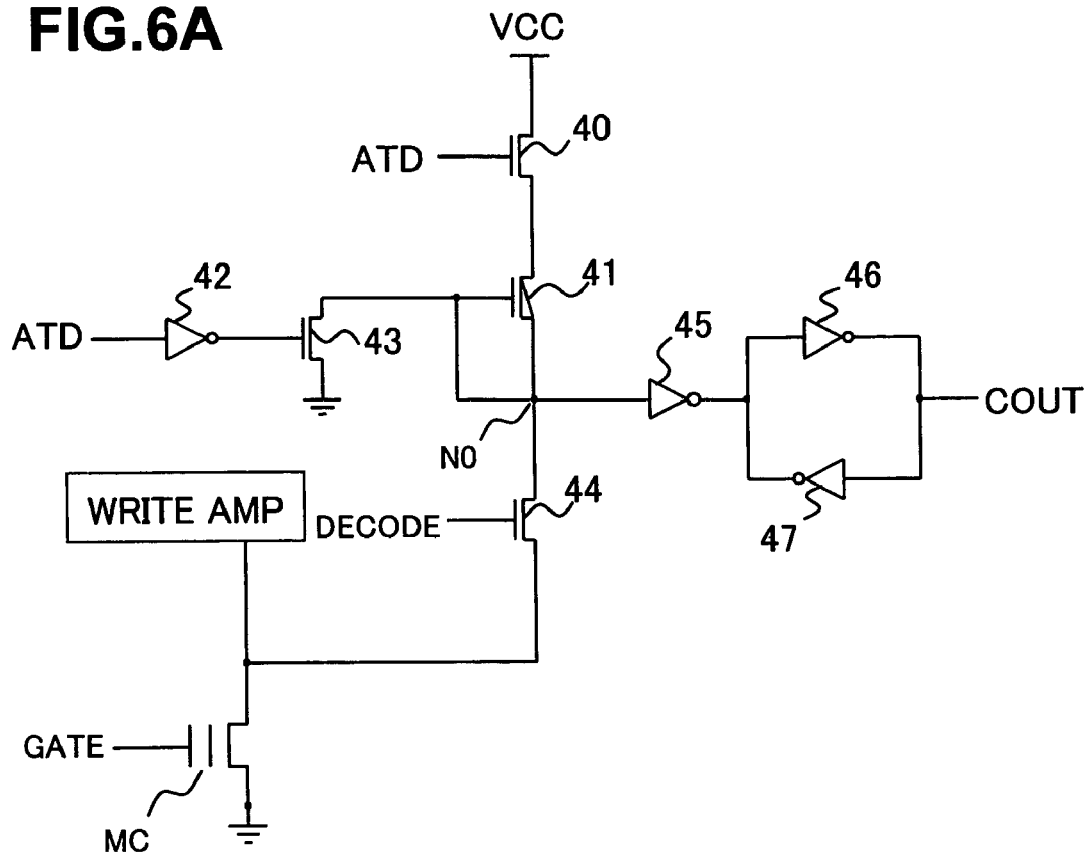
FIG. 6 shows the redundancy memory circuit and a timing chart of its operations.

FIG. 6 shows a redundancy memory circuit and a timing chart detailing its operations. FIG. 6A is a circuit diagram of the redundancy memory 10. The redundancy memory has a memory cell transistor MC that stores the replacement information, and two inverters 46, 47 making up a latch circuit. The memory cell transistor MC is a non-volatile memory having a floating gate, and a write-amplifier circuit is connected to the drain thereof. The replacement information data is stored in the memory cell transistor MC. For example, in the case of data [1], no charge is implanted in the floating gate, the threshold voltage of the memory cell transistor MC becomes low, and when the gate GATE is voltage-boosted during readout the transistor MC conducts. In the case of data [0], however, a charge is implanted to the floating gate and the threshold voltage becomes high; and even if the gate GATE is voltage-boosted at the time of readout, the transistor MC does not conduct.

Figure 6B:
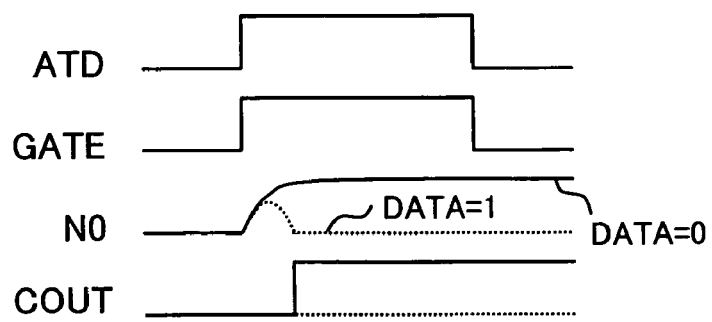

This procedure will be further explained in reference to the operation timing chart provided in FIG. 6B. In the early state the address change signal ATD is at L-level, the transistor 43 conducts by means of an inverter 42, whereas the transistor 40 is in a non-conducting state, so that the node N0 is at L-level. Consequently, the redundancy memory output COUT is at L-level. Next, when the address change signal ATD changes to H-level, the transistor 43 enters a non-conducting state, the transistor 40 conducts, and the gate GATE moves to boost voltage level. Consequently, if the memory cell transistor MC has data [0], the memory cell transistor MC does not conducts, and the node N0 rises to the level of the power source Vcc; if it has data [1], the memory cell transistor MC conducts, and the drain current of the memory cell transistor MC is larger than that of the transistor 40, so that the node N0 becomes at L-level. In other words, the node N0 rises and falls in response to the replacement information data stored in the memory cell transistor. When the node N0 rises, the state of the latch circuit inverts and the output COUT changes from L-level to H-level. On the other hand, if the node N0 does not rise but falls, then the state of the latch circuit does not invert, and the output COUT maintains L-level.

In this way, the redundancy memory 10 has its readout of data [0] slow when the drive capability of the transistor 40 is small, and its readout of data [1] slow when the drive capability of the memory cell transistor MC is small. Because the output COUT of the redundancy memory simply maintains the L-level state in the case of data [1], it is impossible to know the timing according to which it might complete a readout of data [1].

It should be noted that the transistor 44 is a selection transistor that conducts in response to the redundancy memory detection signal DECODE.

Figure 7A:
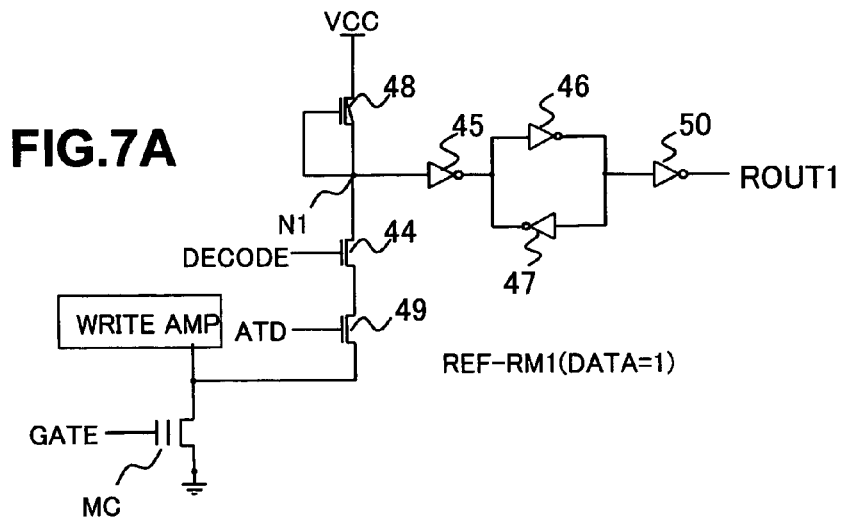
FIG. 7 shows the reference redundancy memory circuit and a timing chart of its operations according to a second embodiment of the present invention.
Figure 7B:
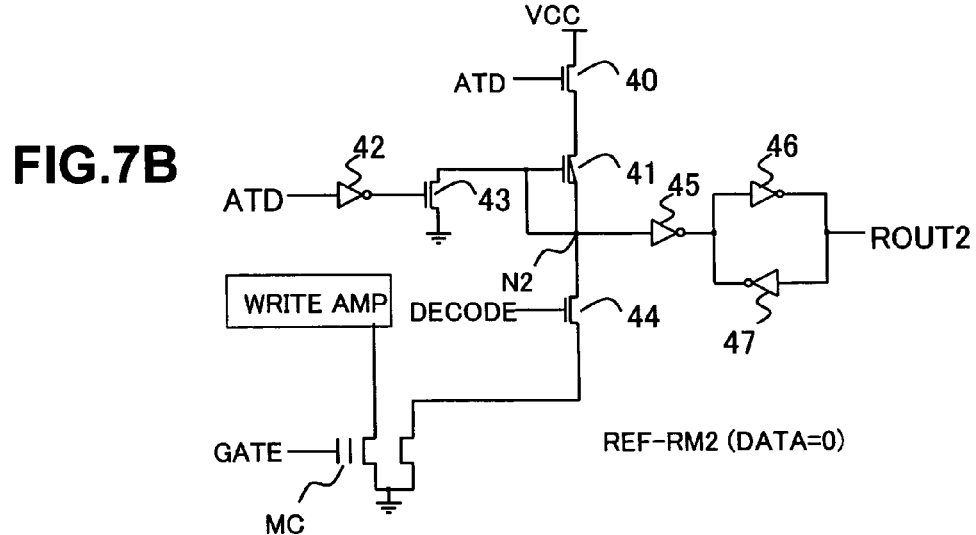
Figure 7C:
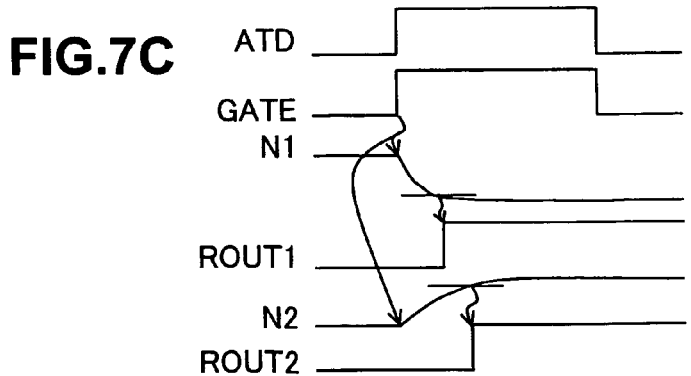

FIG. 7 shows the circuit diagram of the reference redundancy memory according to the second embodiment and a timing chart of its operations. FIG. 7A shows the first reference redundancy memory circuit that stores data [1]. Since data [1] is always stored in this memory cell transistor MC, no charge is implanted to the floating gate, the threshold voltage is low, and if the gate GATE is voltage boosted at the time of the rising edge of the address change signal ATD, the memory cell transistor MC conducts. Therefore, a P-channel transistor 48 is provided between the node N1 and the power source Vcc, and this node N1 is at H-level during the initial state. Because an inverter 50 is provided at the last step of the latch circuit made up of the inverters 46, 47, the output ROUT1 is at L-level in the initial state. Then when the gate GATE is voltage-boosted after the rising edge of the address change signal ATD, the memory cell transistor MC conducts, the node N1 falls from H-level to L-level, eventually inverting the inverter 45, so that the output ROUT1 changes from L-level to H-level. In other words, the first reference redundancy memory detects when the readout of [1]-type data is completed. The transistor 49 conducts in response to the rising edge of the address change signal ATD; the rising edge of the address change signal ATD serves as a trigger to start the change in the node N1.

FIG. 7B shows the circuit of the second reference redundancy memory, which stores [0]-type data. The usual state is for data [0] to be stored in this memory cell transistor MC. Consequently, a charge is implanted into the floating gate, the threshold voltage is high, and even if the gate GATE is voltage-boosted at the time of the rising edge of the address change signal ATD, the memory cell transistor MC remains in the non-conductive state. The second memory reference redundancy memory has the same circuit as the reference redundancy memory shown in FIG. 6. In other words, in the initial state the node N2 is at L-level, then in response to the rising wave of the address change signal ATD, the transistor 40 conducts and the node N2 boosts to the voltage of the power source Vcc. As a consequence this boost, the inverter 45 inverts, changing the state of the latch circuit and causing the output ROUT2 to change from its initial L-level state to H-level. In other words, the operation is the same as in the redundancy memory 10 with data [0]. In this way, the second reference redundancy memory detects when the readout of data [0] has been completed.

By using the first and second reference redundancy memories shown in FIG. 7 it is possible to detect completion of the readout of data [0] and [1] respectively within the redundancy memory. Consequently, by determining the output of the redundancy memory 10 when both the outputs ROUT1, ROUT2 of the first and second reference redundancy memories change to H-level, it is possible to determine the output of the redundancy memory, and to correctly determine the redundancy memory data in the shortest possible time timing.

In the case of the first embodiment, data whose readout within the redundancy memory 10 will be slow is estimated in advance, and the reference redundancy memory 10R that normally stores this slow data is employed. In other words, the reference redundancy memory shown in FIG. 7A or FIG. 7B is employed. However, in this case, it cannot cope with unevenness of readout speeds caused by uneven manufacture.

Figure 8:
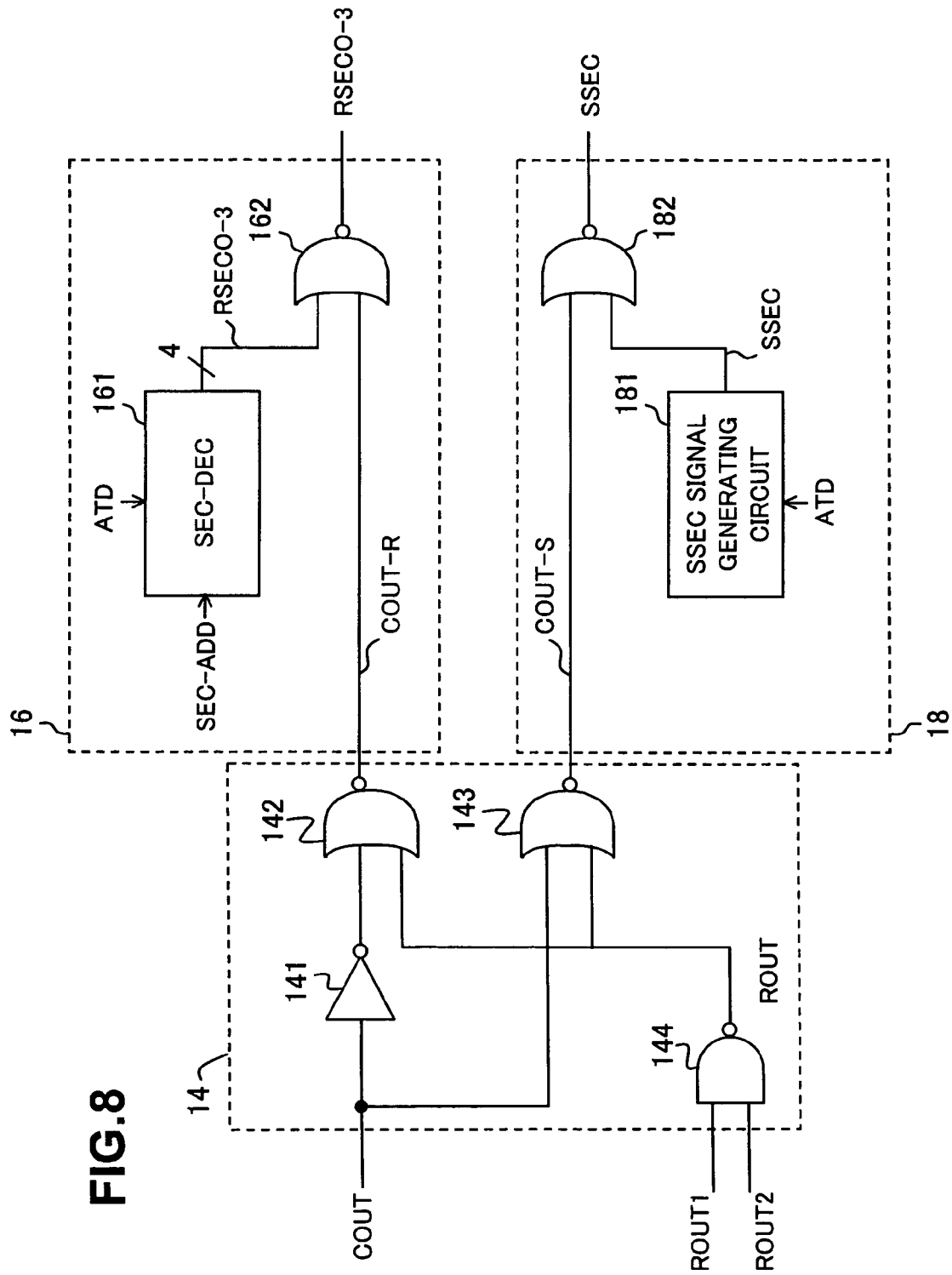
FIG. 8 shows the redundancy memory output circuit and the sector selection signal generating circuit.

FIG. 8 shows the redundancy memory output generating circuit and the sector selection signal generating circuit. Within redundancy memory output circuit 14, when the outputs ROUT1, ROOUT2 of the first and second reference redundancy memories are H-level, the signal ROUT that determines the readout determination is set to L-level by means of the NAND gate 144, and the redundancy memory output COUT and its inverted signal are outputted as the outputs COUT-S, COUT-R via the NOR gates 142, 143. That is to say, the output of the redundancy memory is defined by the NOR gates 142, 143.

The regular sector selection signal generating circuit 16 has a sector decoder 161 that decodes the sector address SEC-ADD and a NOR gate 162. The sector decoder 161 decodes the sector address SEC-ADD in response to the address change signal ATD, and sets a selected one of the regular sector selection signals RSED0-3 to H-level. That is to say, the output of the sector decoder 161 has four parts, corresponding to the number (4) of regular sectors. Correspondingly, four of the NOR gate 162 are also provided, and there are four regular sector selection signals RSEC0-3. Then when one of the regular sector selection signals RSEC0-3 goes to H-level in response to the rising edge of the address change signal ATD, the row decoder X-DEC of one of the regular sectors SEC0-3 starts its decoding operation. When the timing signal ROUT goes to L-level the output COUT of the redundancy memory is determined, and based on this the output COUT-R goes to either H-level or L-level. If replacement to the spare sector side is detected, the output COUT-R goes to H-level and all the regular sector selection signals RSEC0-3 go to L-level. Accordingly, the row decoders within the selected regular sector stop decoding. If no replacement to the spare sector side is detected, on the other hand, then the selected state (H-level) of one of the regular sector selection signals RSEC0-3 is maintained, with the output COUT-R still at L-level.

The spare sector selection signal generating circuit 18 has an SSEC signal generating circuit 181 that sets the spare sector selection signal SSEC to H-level in response to the rising edge of the address change signal ATD. The row decoders X-DEC within the spare sector SSEC then start the decoding operation. Then when the signal ROUT goes to L-level the redundancy memory output COUT is determined and the output COUT-S goes to H-level or L-level based on this. If replacement to the spare sector is detected, the selected state (H-level) of the spare sector selection signal SSEC is maintained, with the output COUT-S still at L-level. If no replacement to the spare sector is detected, on the other hand, then the output COUT-S goes to H-level and the spare sector selection signal SSEC is switched to the deselected state (L-level). As a consequence of this, the row decoders X-DEC within the spare sector stop their decoding operation.

Figure 9A:
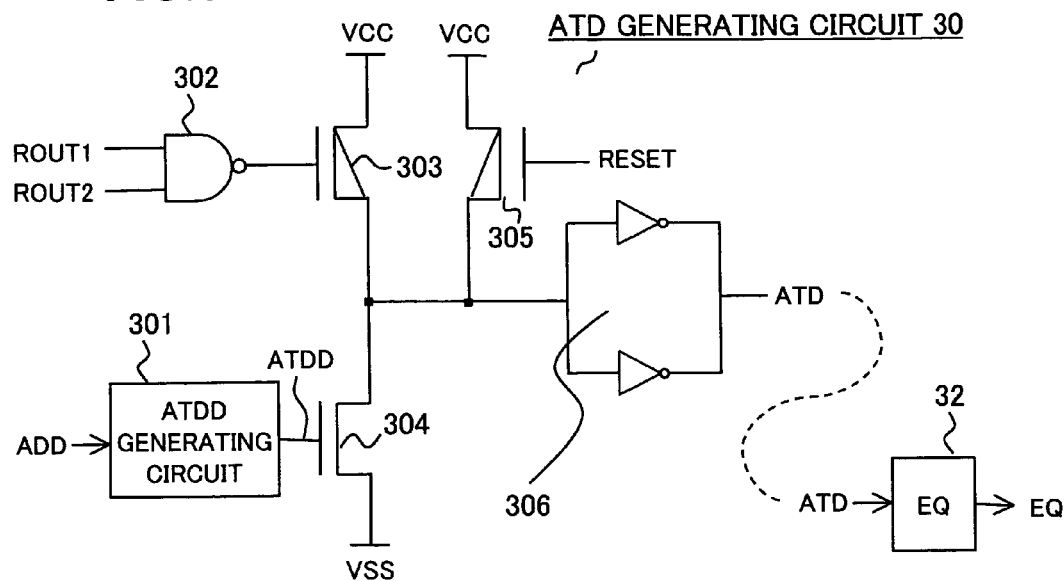
FIG. 9 shows the address change signal generating circuit and a timing chart of its operations.

FIG. 9 shows the address change signal generating circuit and a timing chart of its operations. The ATD generating circuit 30 has an ATDD generating circuit 301 that detects a change in an external address ADD and generates a one-shot pulse ATDD having a fixed pulse length dt2. Then if both the outputs ROUT 1,2 of the first and second reference redundancy memories do not go to H-level even when the one-shot pulse lowers ATDD to L-level after its fixed pulse time dt2, then the address change signal ATD does not go to L-level by means of the NAND gate.

During power down times, the reset signal RESET is at L-level, the P-channel transistor 305 conducts, and the address change signal ATD is at L-level. In an active state, the reset signal RESET goes to H-level, and the transistor 305 turns off. Then, when the one-shot pulse ATDD goes to H-level in response to a change of address ADD, then the transistor 304 conducts and the address change signal ATD goes to H-level. Even when the one-shot pulse ATDD goes to L-level after its fixed pulse length dt2, the latch circuit 306 maintains a state wherein ATD=H. Then when the outputs ROUT1, ROUT2 of the first and second reference redundancy memories go to H-level together, the transistor 303 conducts via the NAND gate 302, and the address change signal ATD goes to L-level.

Figure 9B:
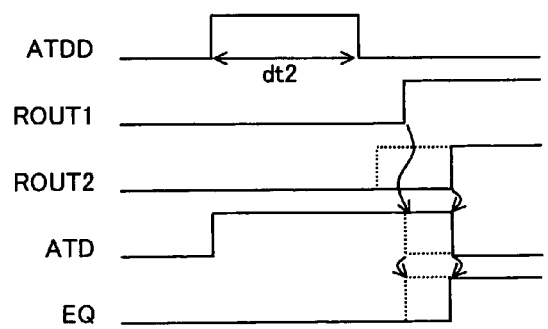

In other words, as shown in the operation timing chart FIG. 9B when the rising edge of the output ROUT2 of the second reference redundancy memory is slow, the address change signal ATD goes to L-level according to that timing, while when the rising edge of the output ROUT1 of the first reference redundancy memory is slow, the address change signal ATD goes to L-level according to that timing, as shown by the broken line. When this address change signal ATD goes to L-level, the sector activation signal EQ is set to H-level in response, and the sector operations continue. In concrete terms, as shown in FIG. 3, the word line that was selected by the row detector is driven to boosted voltage level by the booster circuit and the memory cell readout takes place.

Because the column activation signal EQ is produced when the outputs ROUT1, ROUT2 of the reference redundancy memories go to H-level together, as described above, it is possible to generate the column activation signal EQ according to the fastest possible timing without needing to provide an operation margin. It is also possible to carry out similar control by supplying the reference redundancy memory outputs ROUT1, ROUT2 to the column activation signal generating circuit 32.

INDUSTRIAL APPLICABILITY

The present invention makes it possible to shorten the access time of a flash memory having a spare sector.

What is claimed is:

1. A semiconductor memory having a plurality of regular sectors and a spare sector that can be replaced from a regular sector, comprising:
a regular sector selection signal generating circuit and a spare sector selection signal generating circuit that generate a regular sector selection signal for selecting said regular sector and a spare sector selection signal for selecting said spare sector respectively in response to an address change signal;
a redundancy memory that stores replacement information replacing the regular sector with said spare sector, wherein said replacement information is read out in response to said address change signal; and
a reference redundancy memory having the same memory elements as said redundancy memory, in which stored information of said memory elements is read out in response to said address change signal, and which generates an output signal that changes when said readout is completed,
wherein either said regular sector selection signal or said spare sector selection signal is set to a deselected state based on the replacement information read out from said redundancy memory in response to a change in the output signal of said reference redundancy memory.

2. The semiconductor memory according to claim 1, wherein said reference redundancy memory stores information for which readout time of said redundancy memory is the longest.

3. The semiconductor memory according to claim 1, wherein said reference redundancy memory comprises a first and a second reference redundancy memories which store a first and a second information that said redundancy memory can store, and of which output changes at the readout operation, and wherein the output signal of said reference redundancy memory is generated when both of the outputs of said first and second reference redundancy memories change.

4. The semiconductor memory according to claim 3, wherein said first reference redundancy memory changes from a first-level output state to a second-level output state upon completion of readout of said first information that accompanies the readout operation executed in response to said address change signal, and said second reference redundancy memory changes from a first-level output state to a second-level output state upon completion of readout of said second information that accompanies the readout operation executed in response to said address change signal.

5. The semiconductor memory according to claim 1, wherein said regular sector and said spare sector each has a row decoder that selects a word line based on a row address, each beginning an decoding operation in response to said regular sector selection signal and said spare sector selection signal respectively, and stopping the decoding operation when said selection signal changes to a deselected state.

6. The semiconductor memory according to claim 5, wherein after the generation of said address change signal, a sector activation signal is generated in response to a change in the output signal of said reference redundancy memory, and the row decoders of said regular sector and said spare sector drive their respective word lines to a selection level in response to said sector activation signal, respectively.

7. The semiconductor memory according to claim 5, wherein after the generation of said address change signal, a sector activation signal is generated in response to a change in the output signal of said reference redundancy memory, and the row decoders of said regular sectors and said spare sector drive their respective word lines to a boost-voltage selection level in response to said sector activation signal, respectively.

* * * * *